United States Patent
Tanase

(10) Patent No.: US 6,778,570 B2
(45) Date of Patent: Aug. 17, 2004

(54) LASER DRIVING APPARATUS AND METHOD

(75) Inventor: Hironobu Tanase, Kanagawa (JP)

(73) Assignee: Sony Corporation, Tokyo (JP)

( * ) Notice: Subject to any disclaimer, the term of this patent is extended or adjusted under 35 U.S.C. 154(b) by 34 days.

(21) Appl. No.: 10/137,453

(22) Filed: May 3, 2002

(65) Prior Publication Data

US 2002/0163946 A1 Nov. 7, 2002

(30) Foreign Application Priority Data

May 7, 2001 (JP) ......................................... 2001-136486

(51) Int. Cl.$^7$ .............................................. H01S 3/00
(52) U.S. Cl. .................................. 372/38.02; 372/38.1
(58) Field of Search ........................... 372/38.02, 38.1, 372/38.04, 38.07

(56) References Cited

U.S. PATENT DOCUMENTS

| | | | | |
|---|---|---|---|---|
| 5,694,409 A | * | 12/1997 | Taguchi | 372/38 |
| 5,825,733 A | * | 10/1998 | Ogawa | 369/47.48 |
| 5,883,378 A | * | 3/1999 | Irish et al. | 250/214 |
| 5,936,986 A | * | 8/1999 | Cantatore et al. | 372/38 |
| 6,489,600 B1 | * | 12/2002 | Taguchi | 250/205 |

* cited by examiner

Primary Examiner—Don Wong
Assistant Examiner—Leith A Al-Nazer
(74) Attorney, Agent, or Firm—Oblon, Spivak, McClelland, Maier & Neustadt, P.C.

(57) ABSTRACT

A device for driving a semiconductor laser in which, when a high frequency signal is superposed on a driving signal for the semiconductor laser for suppressing the scoop noise in the semiconductor laser, the amplitude of the high frequency signal can be controlled reliably and satisfactorily without dependency on temperature characteristics or chronological changes in the semiconductor laser. To this end, the device for driving the semiconductor laser includes a voltage controlled oscillator for superposing a high frequency signal on the driving signal for the semiconductor laser LD, a photodetector for receiving at least a portion of the light radiated from the semiconductor laser, an amplitude information extraction unit for extracting the amplitude information based on an output signal of the photodetector, input through a narrow band-pass filter or high-pass filter configured for extracting high frequency, and a comparator for comparing the amplitude information obtained from the amplitude information extraction unit to a reference value to control the voltage controlled oscillator based on the results of comparison.

6 Claims, 2 Drawing Sheets

LASER DRIVING APPARATUS AND METHOD

BACKGROUND OF THE INVENTION

Field of the Invention

This invention relates to laser driving methods and apparatus for driving a semiconductor laser used for example in reading out information signals from an optical disc.

Up to now, for reading out information signals from an optical disc, such as a phase change optical disc or from a magneto-optical disc, an optical pickup device, having a semiconductor laser as a light source, has been in use. In this optical pickup device, the semiconductor laser is driven by a laser driving device.

As for this laser driving device, it has been proposed to control the light emission output of the semiconductor laser using a so-called automatic power control (APC) circuit in which part of the light emitted by the semiconductor laser is received by a photodetector, such as a photodiode, and in which a driving signal for the semiconductor laser is controlled based on an output signal of the photodetector.

In this laser driving device, such a device has been proposed in which, for suppressing the so-called scoop noise produced by the semiconductor laser by the reflected light from the optical disc returning to the semiconductor laser, high frequency components are superposed by a voltage output type oscillator on the driving signals for the semiconductor laser.

Meanwhile, in the above-described laser driving device, since the superposed high frequency signal is of a high frequency and moreover the light waveform is of the complicated distorted wave, it has been difficult to control the amplitude. That is, since certain APC circuits cannot follow the high frequency signals superposed on the laser driving signals, amplitude fluctuations of the superposed high frequency signals cannot be suppressed, even though control of the light emission output of the semiconductor laser is possible as concerns the low frequency components, that is signals ranging from the DC signal to RF range signals. In this consideration, the conventional laser driving device uses a system in which the amplitude of the superposed high frequency signal is set to a desired value and supplied as a fixed output to the semiconductor laser.

However, the semiconductor laser is susceptible to variation due to temperature characteristics or chronological deterioration, such that, due to these factors, the semiconductor laser tends to be fluctuated in light output for a constant light input. That is, as for the temperature characteristics, the slope efficiency is lowered with rise in the environment temperature. On the other hand, if the superposed high frequency signal is driven with a voltage, temperature characteristics of the differential resistance of the semiconductor laser cannot be disregarded, this tendency becoming the lower the higher becomes the environment temperature. In this case, the high frequency current tends to be increased, such that the peak output is likely to be higher in association with current—light output (I-L) characteristics. Since the peak output is increased due to such variations, the information signals, attempted to be read out from a rewritable optical disc, may be inadvertently erased in the worst case.

SUMMARY OF THE INVENTION

It is therefore an object of the present invention to provide a laser driving device and a laser driving method in which, when a high frequency signal is superposed on the driving signal for suppressing the scoop noise, the amplitude of the high frequency signal can be controlled reliably and satisfactorily without dependency on temperature characteristics or chronological changes in the semiconductor laser.

In one aspect, the present invention provides a laser driving device including a voltage controlled oscillator for superposing a high frequency signal on a driving signal for a semiconductor laser, a photodetector for receiving at least a portion of the light radiated from the semiconductor laser, amplitude information extraction means for extracting the amplitude information based on an output signal from the photodetector input through a narrow band-pass filter or a high-pass filter configured for extracting high frequency, and comparator means for comparing the amplitude information obtained by the amplitude information extraction means to a reference value to control the voltage controlled oscillator based on the results of comparison.

In another aspect, the present invention provides a laser driving method including superposing a high frequency signal on a driving signal for semiconductor laser, receiving at least a portion of the light radiated from the semiconductor laser by a photodetector, inputting an output signal from the photodetector to amplitude information extraction means through a narrow band-pass filter or a high-pass filter configured for extracting high frequency, causing the amplitude information extraction means to extract the amplitude information which is based on the output signal, comparing the amplitude information to a reference value, and controlling the superposition of the high frequency signal based on the results of comparison.

In the laser driving device and in the laser driving method according to the present invention, the amplitude information of the high frequency signal, obtained from the photodetector, is converted into a DC signal level in the direct vicinity of the photodetector, so that the information on the superposed amplitude can be transmitted to the next stage without the necessity of taking the wiring layout into account.

Moreover, since the amplitude information is converted into the DC voltage level, the working range of the one-cycle transfer gain can be lowered to afford a degree of freedom in the designing of phase allowance of the feedback system.

Moreover, if the high frequency signal is the distorted wave, there is raised no particular problem in the feedback control system because negative feedback is applied with the DC signal.

In the laser driving device and in the laser driving method according to the present invention, the amplitude of the high frequency signal superposed on the driving signals for the semiconductor laser can be controlled easily.

This enables control of the light peak output, which it has been impossible to control with the conventional APC circuit, such that the peak output can be maintained constant without dependency on changes in characteristics of the current—light output (I-L characteristics) or chronological changes in the semiconductor laser.

In this manner, the amplitude of the superposed high frequency signal can be stabilized without dependency on the changes in the characteristics of the semiconductor laser to evade inadvertent data erasure in the rewritable optical disc caused by superposition.

That is, the present invention provides a laser driving device and a laser driving method whereby, in superposing the high frequency signal on the driving signal for scoop noise suppression, the amplitude can be controlled reliably satisfactorily without dependency on temperature characteristics or chronological changes of the semiconductor laser.

DESCRIPTION OF THE PREFERRED EMBODIMENTS

Figure 1:
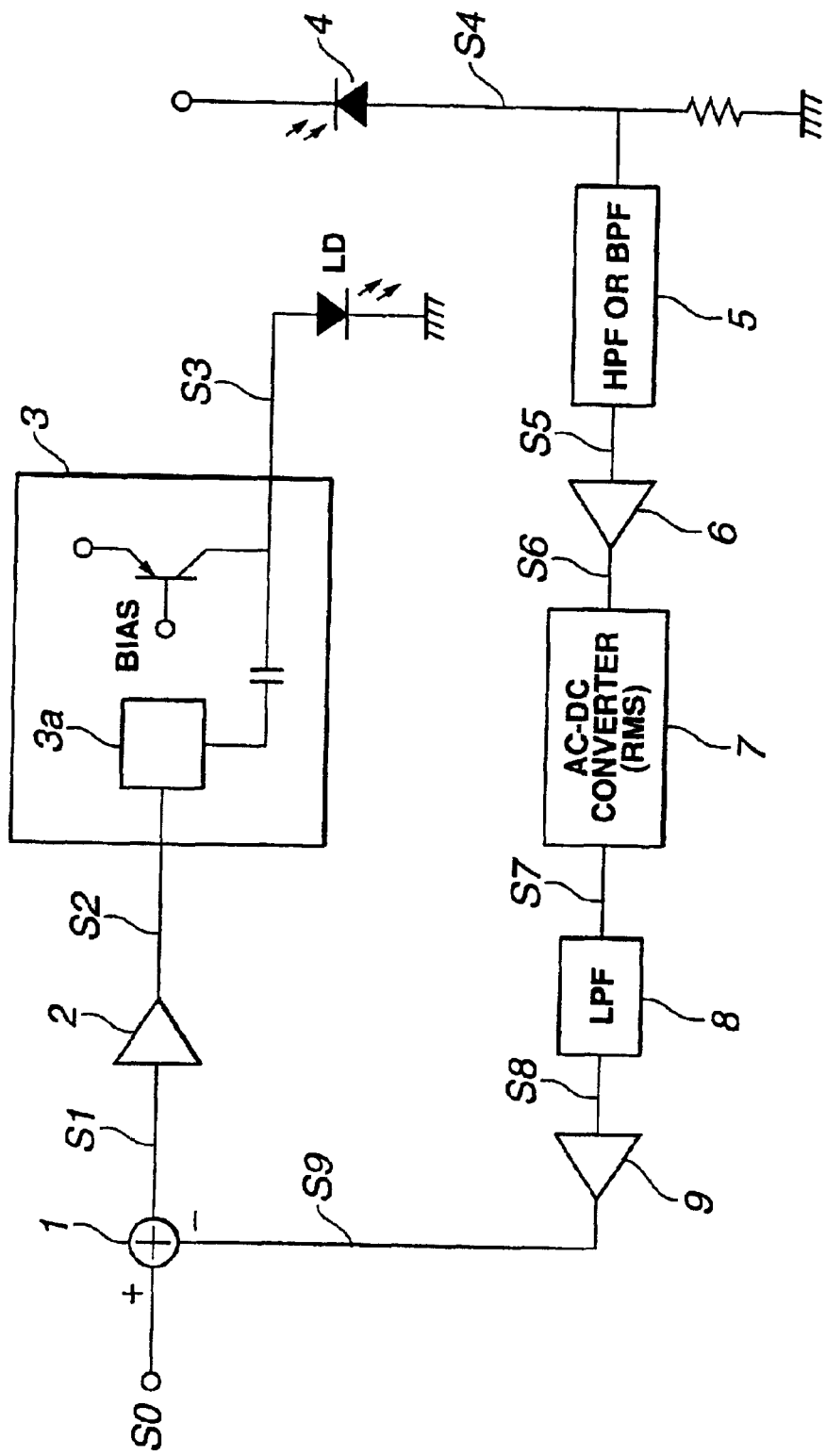
FIG. 1 is a block diagram showing a laser driving device and a laser driving method embodying the present invention.

Referring to the drawings, preferred embodiments of the present invention will be explained in detail.

The laser driving method according to the present invention may be carried out by a laser driving method of the present invention as now explained. In this laser driving device, shown in FIG. 1, a driving signal S0 for driving a semiconductor laser is input to a non-inverting input terminal (+) of a differential circuit (subtraction circuit) 1, operating as comparator means, and is thence supplied, as a driving signal S1, to a high-gain amplifier 2 used as a feedback controller. A driving signal S2, output from the high-gain amplifier 2, is input to a semiconductor laser driving circuit 3.

This semiconductor laser driving circuit 3 includes a high-frequency oscillator circuit (OSC) 3a, which is a voltage controlled oscillator capable of controlling the amplitude of the oscillation signal with a DC voltage. This high-frequency oscillator circuit 3a superposes high frequency signals on the driving signal S2. A preset bias is applied by an unnumbered transistor to the driving signal, on which the high frequency signals have been superposed by the high-frequency oscillator circuit 3a. The driving signal, thus biased, is sent as a driving signal S3 to a semiconductor laser LD.

At least a portion of a light beam, produced on oscillations of the semiconductor laser LD, is received by a photodetector (light receiving element) 4, such as a photodiode. An output signal S4 of the photodetector 4 is converted from the electrical current into the electrical voltage (I-V conversion) and supplied to a narrow band-pass or high-pass filter 5 which extracts the high frequency signals. As this filter 5, a narrow band-pass filter (BPF) having a center frequency of the order of ±hundreds of MHz and a passband on the order of ±one hundred MHz, or a high pass filter (HPF) having a cut-off frequency on the order of 100 to 300 MHz, may be used. An output signal S5 of this filter 5 is sent through a high-frequency pre-amplifier 6 to an AC (alternating current) to DC (direct current) converting circuit (RMS) 7, operating as amplitude information extraction means of converting the AC signal signal to the DC signal signal to extract the amplitude information.

A DC signal S7, as an output of the AC-DC converter circuit 7, is input through a low-pass filter 8 as a signal S8 to a DC amplifier 9. An output signal of this DC amplifier 9 is input to an inverting input terminal (−) of the differential circuit 1. As the cut-off frequency of the low-pass filter 8, the frequency on the order of tens of kHz, for example, may be used.

Among the AC-DC conversion circuits 7 that may be used, a peak-holding circuit, a log conversion circuit, a combination of an inverse log converting circuit-smoothing circuit and a combination of a half-wave rectifier circuit and a smoothing circuit, may be used in addition to a effective value (root means square) circuit (RMS).

In the above-described laser driving circuit, a driving signal S0 of an optional constant positive signal level is applied to the non-inverting input terminal (+) of the differential circuit 1. This differential circuit 1 outputs a signal S1 corresponding to the difference between the level of a non-inverting input S0 and that of an inverting input S9. This level may for example be a voltage level. This signal S2 is input to the high-gain amplifier 2, which high-gain amplifier then amplifies the input level with a high gain to output the signal S2. This high-gain amplifier 2 is of the type in which the variations of current to optical output characteristics with temperature proper to the semiconductor laser LD are suppressed by feedback control and hence only a small gain bandwidth product suffices.

If the signal S9 applied to the inverting input terminal (−) of this differential circuit 1 is zero, the signal level of the output signal S2 of the high-gain amplifier 2 increases. The output signal S3 of the high-frequency oscillator circuit 3a then commences to be oscillated at a frequency determined by a circuit constant. The amplitude of the high frequency signal increases monotonously with the increasing output signal S2 of the high-gain amplifier 2.

The high-frequency oscillator circuit 3a is enclosed in the semiconductor laser driving circuit 3. In supplying a signal to the semiconductor laser LD, the signal may be supplied through a driving circuit or directly from the oscillator circuit, as shown in FIG. 1. That is, if a transistor for driving a semiconductor laser is not interposed, the high frequency signals are input from the high-frequency oscillator circuit 3a through a coupling capacitor to the semiconductor laser LD. In the oscillator 3a, the output amplitude is changed in dependence upon the level of the input signal S2, so that the amplitude of the high frequency signal superposed on the signal S3 applied to the semiconductor laser LD is changed to produce the desired superposed light amplitude. This applies high frequency superposition on the laser light emitted by the semiconductor laser LD. The peak output of the light emission waveform increases with increasing oscillation amplitude of the high frequency signal.

The light signal emitted by the semiconductor laser LD is received by the high range photodetector 4 and converted into an electrical signal (current) S4. The so produced signal S4 is directly input to a filter 5 (narrow band-pass filter or a high-pass filter). The filter 5 interrupts the DC signal and prohibits an operating point of the high frequency amplifier 6 of the next stage from being fluctuated to extract the amplitude information. This filter 5 prohibits the DC signal from affecting the operating point (voltage) of the high frequency amplifier 6, while contributing to increasing the dynamic range of the high frequency amplifier 6.

The high frequency amplifier 6 of the next stage is provided in consideration that the signal S4 obtained in the photodetector 4 is of a small amplitude and hence the feedback signal S5 is of a small amplitude. So, the high frequency amplifier 6 amplifies the signal S4 to an amplitude which will enable the operation of the next stage AC-DC converting circuit 7. This assures the S/N ratio in the AC-DC converting circuit 7 and a diminished conversion error.

The so produced high frequency signal S6 is input to the AC-DC converting circuit 7 and thereby converted into a DC signal S7 of a level corresponding to the amplitude. That is, the AC-DC converting circuit 7 converts the AC signal into a RMS value and outputs the resulting RMS value at the DC level as the signal S7.

This DC signal S7 is input to the low-pass filter 8 and thereby formed into the DC signal S8 improved in stability. This signal S8 is input to the DC amplifier 9. The low-pass filter 8 lowers the open loop band. As the low-pass filter 8, such a filter having a cut-off frequency on the order of tens of kHz may be used. The Dc amplifier 9 amplifies the input signal to increase the feedback ratio to lower the closed-loop gain to allow for facilitated amplitude adjustment to a desired amplitude. By these operations, the loop band of the feedback control system may be lowered so that there is no necessity for taking radiation caused by wiring layout into account. It should be noted that the amplifier 9 is included in the feedback circuit, while the signal handled is DC, so that the amplifier 9 with a low temperature drift is necessitated.

The DC signal S9 is input to the inverting input terminal (−) of the differential circuit 1. The differential circuit 1 outputs a signal S1 corresponding to the difference between the level of the non-inverting input S0 and the level of the inverting input S9. The level may for example be a voltage level.

When the superposed amplitude of the laser light is increased, the signal S9 input to the inverting input terminal (−) of the differential circuit 1 is increased. Since the level of the signal S0 input to the non-inverting terminal (+) is constant, the signal level of the output signal S2 of the high-gain amplifier 2 is lowered. Conversely, when the superposed amplitude of the laser light is decreased, the level of the signal S9 input to the inverting input terminal (−) of the differential circuit 1 is diminished, while the output signal S2 of the high-gain amplifier 2 is increased in level to increase the level of the output signal S3 of the high-frequency oscillator circuit 3a. By this operating principle, the superposed high frequency amplitude in the laser light is controlled in case the superposed amplitude of the light waveform is fluctuated with temperature characteristics of the semiconductor laser LD.

By controlling the high-frequency oscillator circuit 3a with a preset time constant, it is possible to suppress variations of the amplitude of the high frequency signal superposed on the driving signal caused by variations in the temperature of the light waveform.

Figure 2:
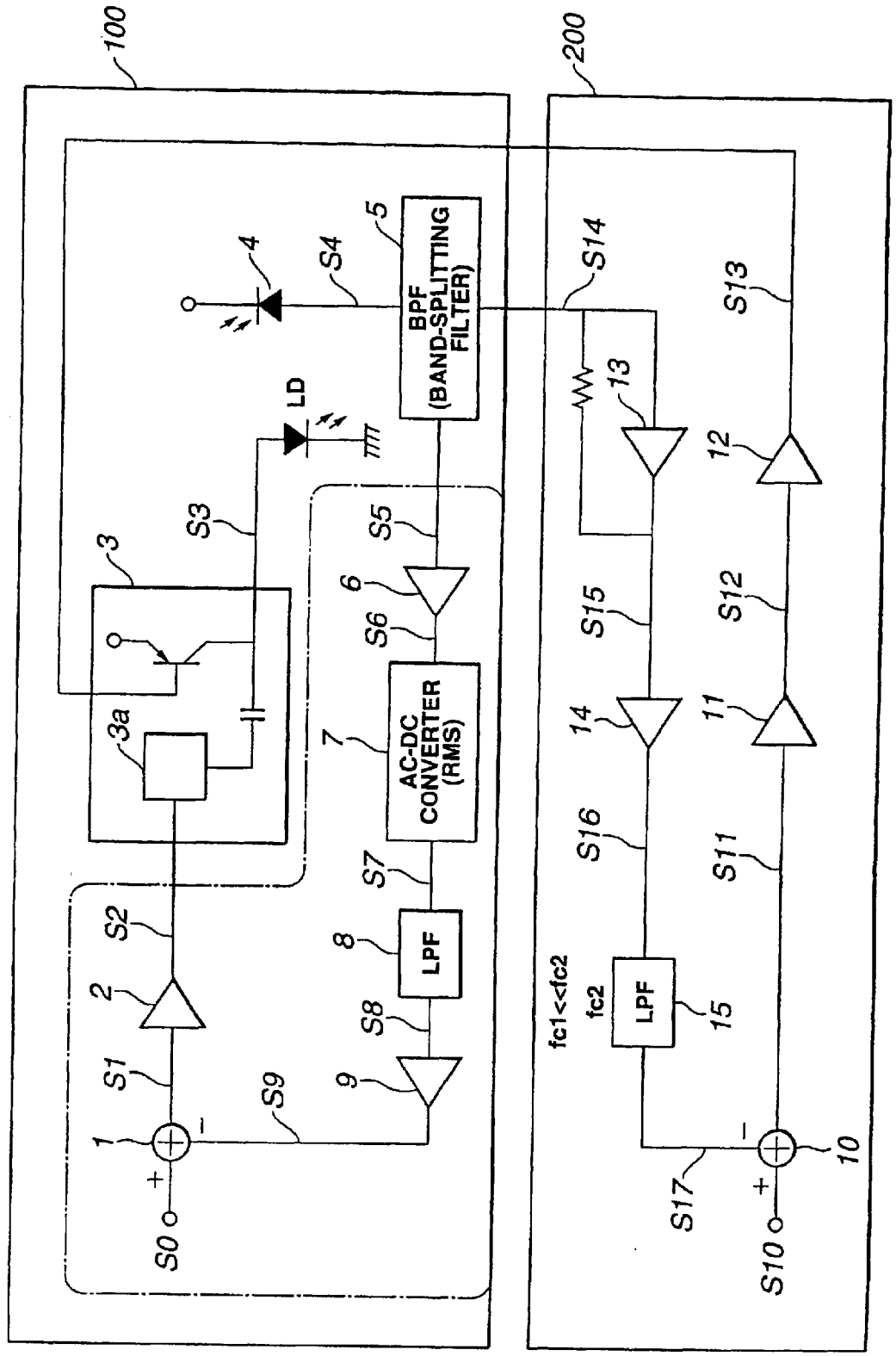
FIG. 2 is a block diagram showing the structure in case the laser driving device is used in conjunction with an APC circuit.

The laser driving device according to the present invention may be provided with an automatic power control circuit (APC circuit) 200, as shown in FIG. 2. The laser driving method of the present invention may also be executed with this laser driving device.

In this laser driving device, a high frequency superposed amplitude control circuit 100 is configured substantially similarly to the laser driving device shown in FIG. 1. However, with the present high frequency superposed amplitude control circuit 100, the filter 5 is a band splitting filter, such that the input signal is split into a high frequency component and a low frequency component, with the low frequency component being fed back to the APC circuit 200.

That is, in this laser driving device, an APC circuit 200 is connected to a terminal of the filter 5 outputting the low frequency component. That is, the APC circuit 200 is made up of a differential circuit 10, a high-gain amplifier 11, an inverting amplifier circuit 12 for polarity adaptation for the feedback control system, a current voltage converting circuit 13, an inverting amplifier circuit 14 for polarity adaptation for the feedback control system, and a low-pass filter 15. Meanwhile, the inverting amplifier circuits 12, 14 may sometimes be omitted because these are used for polarity adaptation for the feedback control system.

A signal S14, output from the output terminal of the filter 5 outputting the low frequency components, becomes a signal S15 through the current voltage converting circuit 13, then becomes a signal S16 through the inverting amplifier circuit 14 to then to become a signal S17 through the low-pass filter 15. The signal S17 is then input to the inverting input terminal of the differential circuit 10. To the non-inverting input terminal of the differential circuit 10 is input a reference signal S10. An output signal S11 of the differential circuit 10 becomes a signal S12 through the high-gain amplifier 11 and then becomes a signal S13 through the inverting amplifier circuit 12 so as to be input to the semiconductor laser driving circuit 3.

The open loop band for superposition control in this laser driving device is set so as to be sufficiently smaller than the open loop band of the APC circuit 200 by the setting of the low-pass filter 8 of the superposition control circuit and of the low-pass filter 15 of the APC circuit 200. As for the low-pass filter 15, a higher cut-off frequency is desirable on the presupposition that the system in its entirety is not subjected to oscillations. Under the current status of the art, the low-pass filter 15 with a cut-off frequency of the order of tens of kHz is used.

It is assumed that the output signals S13 and S2 of the high-gain amplifier 11 of the APC circuit 200 and the high-gain amplifier 2 of the superposition amplitude control circuit 100 are being output at respective preset levels. At this time, the current flows through the semiconductor laser LD to emit the laser light. Simultaneously, the semiconductor laser LD rises in temperature due to self-heating. By this rise in temperature, the slope efficiency is lowered in the semiconductor laser LD to raise the threshold current value as well as to lower the differentiation resistance. The tendency towards temperature fluctuations differs depending on the system of impressing the high frequency signals to the semiconductor laser LD, such that, in current driving, it depends only on the slope efficiency, whereas, in voltage driving, it depends on both the slope efficiency and the differentiation resistance.

Assuming that the AC current flowing into the semiconductor laser LD is i, the slope efficiency is ç, the differentiation resistance is Rd and the applied voltage is v, the light output p is $$p = ç \cdot i$$

for current driving and $$p = ç \cdot v / Rd$$

for voltage driving. It is seen from these equations that the peak output is low in case of current driving, while being high or low depending on the magnitude of temperature changes caused by ç and Rd. It is assumed here that the peak output rises with rise in temperature, as a result of which the average output is raised. The light signal emitted by the semiconductor laser LD is photo-electrically converted by the photodetector 4 and is split by the filter (band-splitting filter) 5 into low range components and high range components. The signals of the low range components are fed back to the APC circuit 200, while high frequency components are fed back to the superposition amplitude control circuit 100.

Since the signal higher in mean level than the setting value is fed back, the output S13 of the APC circuit 200 is lowered and automatically adjusted to the as-set output. On the other hand, the high frequency signal higher than the cut-off frequency is converted by the AC-DC converting circuit 7 into the DC current, such that, if the peak value is increased, the amplitude and the mean square value are increased. The low-pass filter 8 lowers the open loop band and suppresses variations in the superposed amplitude before settling of the output signal S13 of the APC circuit.

In this laser driving device, a peak-holding circuit, a log conversion circuit, a combination of an inverse log converting circuit-smoothing circuit and a combination of a half-wave rectifier circuit and a smoothing circuit, may be used in addition to a effective value (root means square) circuit (RMS) as the usable types of the AC-DC converting circuit 7.

What is claimed is:

1. A laser driving device comprising:

a voltage controlled oscillator configured to superimpose a high frequency signal on a driving signal for a semiconductor laser;

a photodetector for receiving at least a portion of the light radiated from said semiconductor laser;

amplitude information extraction means for extracting amplitude information based on an output signal from said photodetector input through a narrow band-pass filter or a high-pass filter configured for extracting high frequency; and comparator means for comparing the amplitude information obtained by said amplitude information extraction means to a reference value to control the voltage controlled oscillator based on the results of comparison.

2. The laser driving device according to claim 1 wherein the amplitude information is a sign obtained on extracting only AC components, to the exclusion of DC components, from an output signal of the photodetector.

3. The laser driving device according to claim 1 wherein said comparator means controls the voltage controlled oscillator at a preset time constant to suppress fluctuations in the amplitude of the high frequency signal superposed on said driving signal caused by temperature variations in a package of the semiconductor laser.

4. The laser driving device according to claim 1 further comprising:

an automatic light output control circuit to which an output signal from the photodetector is input through a narrow band-pass filter or a high-pass filter configured for extracting high frequency, and which, based on said output signal, adjusts the bias of a driving signal having the high frequency superposed thereon.

5. A laser driving method comprising:

superposing a high frequency signal on a driving signal for semiconductor laser;

receiving at least a portion of the light radiated from the semiconductor laser by a photodetector;

inputting an output sign from said photodetector to amplitude information extraction means through a narrow band-pass filter or a high-pass filter configured for extracting high frequency;

causing said amplitude information extraction means to extract the amplitude information which is based on said output signal;

comparing said amplitude information to a reference value; and controlling the superposition of said high frequency signal based on the results of comparison.

6. The laser driving method according to claim 5 further comprising:

inputting the output signal of the photodetector to an automatic light output control circuit through the narrow band-pass filter or high-pass filter configured for extracting high frequency; and causing said automatic light output control circuit to adjust the bias of the driving signal, having the high frequency signal superposed thereon, based on said output signal.

* * * * *

UNITED STATES PATENT AND TRADEMARK OFFICE
CERTIFICATE OF CORRECTION

PATENT NO. : 6,778,570 B2  
DATED : August 17, 2004  
INVENTOR(S) : Hironobu Tanase Page 1 of 1

It is certified that error appears in the above-identified patent and that said Letters Patent is hereby corrected as shown below:

Column 7,  
Line 32, change "sign" to -- signal --.

Column 8,  
Line 16, change "sign" to -- signal --.

Signed and Sealed this

Eighth Day of February, 2005

JON W. DUDAS  
*Director of the United States Patent and Trademark Office*